United States Patent [19]

DiLazzaro

[11] Patent Number: 4,755,490

[45] Date of Patent: Jul. 5, 1988

[54] LOW FIRING TEMPERATURE CERAMIC MATERIALS

[75] Inventor: John F. DiLazzaro, Lake Oswego, Oreg.

[73] Assignee: Tektronix, Inc., Beaverton, Oreg.

[21] Appl. No.: 110,627

[22] Filed: Oct. 19, 1987

Related U.S. Application Data

[63] Continuation of Ser. No. 853,515, Apr. 18, 1986, abandoned.

[51] Int. Cl.⁴ .................... C03C 8/14; C04B 35/10
[52] U.S. Cl. .................................. 501/17; 501/32; 501/66; 501/128; 501/153; 501/21
[58] Field of Search ............. 501/17, 127, 128, 153, 501/32, 66, 21; 428/472

[56] References Cited

U.S. PATENT DOCUMENTS

| | | | |
|---|---|---|---|
| 3,019,116 | 1/1962 | Doucette | 501/153 |
| 3,457,091 | 7/1969 | Gupta | 501/153 |
| 4,481,261 | 11/1984 | Johnson et al. | 501/17 X |
| 4,536,329 | 8/1985 | Hormadaly | 501/17 X |
| 4,537,703 | 8/1985 | Hormadaly | 501/17 X |

FOREIGN PATENT DOCUMENTS 0103075  6/1985  Japan ................................ 501/17

*Primary Examiner*—Mark L. Bell
*Assistant Examiner*—Karl Group
*Attorney, Agent, or Firm*—William S. Lovell; John D. Winkelman; Richard J. Polley

[57] ABSTRACT

A dense, sintered ceramic material having a low dielectric constant and a low coefficient of thermal expansion is provided from a mixture of 10-50 wt. % alumina, 0-30 wt. % fused silica, and 50-60 wt. % of a frit comprised of CaO, MgO, $Al_2O_3$, $B_2O_3$, and $SiO_2$. The mixture has a minimum sintering temperature in the range of 850°-1000° C., and can be formed by conventional manufacturing techniques. It is particularly useful for the fabrication of single or multilayer electronic circuit substrates.

16 Claims, No Drawings

LOW FIRING TEMPERATURE CERAMIC MATERIALS

This is a continuation of application Ser. No. 853,515 filed Apr. 18, 1986 and now abandoned.

TECHNICAL FIELD

The present invention relates to the field of ceramics, and in particular to glass and ceramic materials sintered at low temperatures to produce dense, nonporous bodies having low coefficients of thermal expansion and low dielectric constants.

BACKGROUND OF THE INVENTION

In the field of electronics, ceramics are used in a variety of applications, including hybrid circuit substrates, passive components, semiconductor packages, and multilayer substrates. Multilayer substrates are formed by laminating a plurality of thin ceramic layers together. Conductive patterns are formed on some or all of the layers prior to lamination, and are selectively connected together in the laminated structure through openings, or "vias", in the individual layers. The ceramic compositions used in such applications generally require very high temperatures (e.g., 1600° C.) for sintering. As a result, the conductive patterns in multilayer ceramic circuits must be formed of refractory metals, such as tungsten, molybdenum, or molybdenum/manganese ("molymanganese"), since metals conventionally used for electronic circuits—copper, gold, silver, and aluminum—would melt during the sintering operation.

The industry has sought in recent years to develop a glass-ceramic material that can be sintered at lower temperatures. Among other advantages, this would permit low resistance, nonrefractory metals, such as gold, silver, and copper, to be used for circuit conductors. The efforts to develop lower firing temperature ceramics have also been directed at obtaining compositions that may be fired in nonoxidizing atmospheres, such as nitrogen, forming gas, or hydrogen, as well as in air, to permit copper to be used as a conductor material. Conventional air firing would oxidize circuitry formed of copper.

Low firing temperature multilayer glass-ceramic substrates have been manufactured from a composition containing 55 wt.% alumina and 45 wt.% lead borosilicate. The environmental toxicity of lead is well documented, and it is therefore desirable to avoid the use of lead compounds in such compositions. Multilayer ceramic substrates also have been produced from a mixture of $Al_2O_3$, $SiO_2$, $ZrO_2$, and MgO sintered at 800° to 1,000° C. in air. The coefficient of thermal expansion of the resulting ceramic is somewhat higher than desired, thus reducing the structural stability of the substrate.

SUMMARY OF THE INVENTION

The present invention is broadly directed to providing improved, low firing temperature glass-ceramic compositions, and to methods for making sintered ceramic materials using such compositions. Preferred compositions include, according to the invention, 10 to 50 wt.% alumina and 50 to 60 wt.% of a frit composed of CaO, MgO, $Al_2O_3$, $B_2O_3$, and $SiO_2$ in amounts such that the mixture has a minimum sintering temperature not greater than 1000° C. and contains a minimal quantity of alkali metal(s). The mixture is sintered at a temperature of at least 850° C., preferably 850°–1050° C., and most preferably 850°–1000° C. The sintering operation may be carried out in oxidizing, neutral, or reducing atmospheres. In certain preferred embodiments of the invention, the mixture of alumina and frit further includes up to 30 wt.% additional fused silica.

DETAILED DESCRIPTION OF PREFERRED EMBODIMENTS

The preferred glass-ceramic compositions of the invention comprise a mixture of three principal components: alumina ($Al_2O_3$), a glass frit, and fused silica ($SiO_2$). The percentages of each component may be varied within the ranges delineated below, depending on the final desired properties of the fired ceramic material. Dense, nonporous, ceramic materials can be formed from such compositions by normal manufacturing techniques and low temperature (i.e., 850°–1000° C.) sintering. In a preferred application of the invention, such a mixture is formed into a thin tape, via holes are punched through the tape at desired locations, and one or more metal conductor paths are formed on the punched tape. Suitable metals for the conductor paths include copper, silver, gold, platinum/gold, and palladium/silver. The tape is subsequently sintered at low temperature, typically after two or more sections have been laminated together to form a multilayer circuit substrate.

Low firing temperature glass-ceramic compositions of the invention are produced by providing a mixture of powdered ingredients, including 10–50 wt.% $SiO_2$, and 50–60 wt.% of a frit, the frit being composed of CaO, MgO, $Al_2O_3$, $B_2O_3$, and $SiO_2$ in amounts such that the mixture has a minimum sintering temperature not greater than 1000° C. and a minimal quantity of alkali metal(s). A quantity of the mixture is then formed into a desired shape using conventional procedures, and sintered at a temperature of at least 850° C., preferably 850°–1050° C., and most preferably 850°–1000° C. The sintering may be conducted in an oxidizing, neutral, or reducing atmosphere. In some applications, the mixture may contain up to 30 wt.% additional fused silica. If the mixture contains more than about 40 wt.% fused silica, bloating of the end product will probably occur. To keep the dissipation factor of the sintered ceramic body low, the mixture should contain a minimal quantity of (preferably substantially no) alkali metal.

In an especially preferred embodiment, the glass-ceramic composition comprises a mixture of 10–50 wt.% alumina, 0–30 wt.% fused silica, and 50–60 wt.% of a frit. A preferred frit comprises about 4 wt.% CaO, 12 wt.% MgO, 13 wt.% $Al_2O_3$, 29 wt.% $B_2O_3$, and 42 wt.% $SiO_2$. The amount of frit used affects the sintering temperature. If too little frit is used (for example, less than about 50 wt.% in this embodiment), the sintering temperature will be too high to achieve the benefits of the present invention. Maintaining the proportion of frit within the range of 50–60 wt.% is necessary to obtain these benefits.

The following examples illustrate preferred ranges of components of the glass-ceramic compositions of the invention. In each example, the frit is composed of 3.5 wt.% CaO, 12.2 wt.% MgO, 13.3 wt.% $Al_2O_3$, 28.9 wt.% $B_2O_3$, and 42.1 wt.% $SiO_2$.

EXAMPLE 1

In this example, the starting materials consisted essentially of 40 wt.% alumina and 60 wt.% glass frit. A mixture of these materials was ground in a ball mill for 20 hours to achieve a particle size of 1–2 microns. The material was then spray dried and formed into 2 in. (5 cm) diameter, ¼ in. (0.6 cm) discs by compressing the milled mixture in a mold at 15,000 psi (1060 kg/cm$^2$). The discs were then fired in air for 1–2 hours at 850° C. The resulting sintered ceramic material had the following properties: fired density 2.76 g/cc; dielectric constant 6.2 at 1 MHz.

The procedure of this example was repeated in the following Examples:

EXAMPLE 2

The starting materials were as follows:
Frit—60 wt.%
SiO$_2$—20 wt.%
Fused silica—20 wt.%
The compressed discs were fired for 1–2 hours at 900° C., producing sintered ceramic bodies with the following properties:
  Fired density—2.45 g/cc
  Coeff. of expansion—4.2 cm/cm/°C.×10$^{-6}$
  Dielectric constant—5.2 at 1 MHz
The coefficient of thermal expansion (CTE) in this and all other examples was determined between 25° and 500° C.

EXAMPLE 3

The starting materials were as follows:
Frit—60 wt.%
Al$_2$O$_3$—10 wt.%
Fused silica—30 wt.%
The compressed discs were fired for 1–2 hours at 950° C., producing sintered ceramic bodies with the following properties:
  Fired density—2.29 g/cc
  Coeff. of expansion—3.8 1 cm/cm/°C.×10$^{-6}$
  Dielectric constant—4.7 at 1 MHz

EXAMPLE 4

The starting materials were as follows:
Frit—55 wt.%
Al$_2$O$_3$—25 wt.%
Fused silica—20 wt.%
The compressed discs were fired for 1–2 hours at 900° C., producing sintered ceramic bodies with the following properties:
  Fired density—2.49 g/cc
  Coeff. of expansion—4.3 cm/cm/°C.×10$^{-6}$
  Dielectric constant—5.2 at 1 MHz

EXAMPLE 5

The starting materials were as follows:
Frit—55 wt.%
Al$_2$O$_3$—20 wt.%
Fused silica—25 wt.%
The compressed discs were fired for 1–2 hours at 900° C., producing sintered ceramic bodies with the following properties:
  Fired density—2.39 g/cc
  Coeff. of expansion—4.0 cm/cm/°C.×10$^{-6}$
  Modulus of rupture—16,000 psi (1125 kg/cm$^2$
  Dielectric constant—5.0 at 1 MHz

EXAMPLE 6

The starting materials were as follows:
Frit—55 wt.%
Al$_2$O$_3$—15 wt.%
Fused silica—30 wt.%
The compressed discs were fired for 1–2 hours at 1000° C., producing sintered ceramic bodies with the following properties:
  Fired density—2.24 g/cc
  Coeff. of expansion—3.9 cm/cm/°C.×10$^{-6}$
  Dielectric constant—4.5 at 1 MHz

EXAMPLE 7

The starting materials were as follows:
Frit—50 wt.%
Al$_2$O$_3$—50 wt.%
Fused silica—0 wt.%
The compressed discs were fired for 1–2 hours at 950° C., producing sintered ceramic bodies with the following properties:
  Fired density—2.73 g/cc
  Coeff. of expansion—5.2 cm/cm/°C.×10$^{-6}$
  Dielectric constant—6.1 at 1 MHz

EXAMPLE 8

The starting materials were as follows:
Frit—50 wt.%
Al$_2$O$_3$—40 wt.%
Fused silica—10 wt.%
The compressed discs were fired for 1–2 hours at 850° C., producing sintered ceramic bodies with the following properties:
  Fired density—2.69 g/cc
  Coeff. of expansion—5.0 cm/cm/°C.×10$^{-6}$
  Modulus of rupture—20,000 psi (1410 kg/cm$^2$
  Dielectric constant—5.9 at 1 MHz

EXAMPLE 9

The starting materials were as follows:
Frit—50 wt.%
Al$_2$O$_3$—30 wt.%
Fused silica—20 wt.%
The compressed discs were fired for 1–2 hours at 900° C., producing sintered ceramic bodies with the following properties:
  Fired density—2.52 g/cc
  Coeff. of expansion—4.6 cm/cm/°C.×10$^{-6}$
  Modulus of rupture—19,000 psi (1340 kg/cm$^2$
  Dielectric constant—5.4 at 1 MHz

EXAMPLE 10

The starting materials were as follows:
Frit—50 wt.%
Al$_2$O$_3$—25 wt.%
Fused silica—25 wt.%
The compressed discs were fired for 1–2 hours at 950° C., producing sintered ceramic bodies with the following properties:
  Fired density—2.40 g/cc
  Coeff. of expansion—4.1 cm/cm/°C.×10$^{-6}$
  Modulus of rupture—20,000 psi (1410 kg/cm$^2$
  Dielectric constant—4.9 at 1 MHz
  Dissipation factor—0.003
This example illustrates the most preferred composition of the present invention.

EXAMPLE 11

The starting materials were as follows:
Frit—50 wt.%
Al$_2$O$_3$—20 wt.%
Fused silica—30 wt.%
The compressed discs were fired for 1–2 hours at 1050° C., producing sintered ceramic bodies with the following properties:

Fired density—2.20 g/cc
Coeff. of expansion—3.9 cm/cm/°C. $\times 10^{-6}$
Dielectric constant—4.5 at 1 MHz

EXAMPLE 12

The starting materials were as follows:
Frit—50 wt.%
$Al_2O_3$—10 wt.%
Fused silica—40 wt.%

The compressed discs were fired for 1–2 hours at 1050° C., producing sintered ceramic bodies with the following properties:
Fired density—2.14 g/cc
Coeff. of expansion—3.4 cm/cm/°C. $\times 10^{-6}$
Dielectric constant—4.2 at 1 MHz To form dielectric layers for multilayer high frequency circuit packages, the starting materials are ground in a ball mill until they have an average particle size of 1–2 microns. A slurry is then formed by combining the finely ground powder with a suitable solvent and other conventional additives, such as a plasticizer and a binder, in a manner know in the art. The slurry is cast into thin "green" (unfired) sheets having a thickness of about 75 to 400 microns using a conventional doctor blading process, after which the green sheets are blanked into individual 125 mm square sheets or tapes. Via holes next are formed in the green sheets by a die punching process. The holes suitably may have a diameter of about 125 microns. A conductor paste is applied in a desired pattern to the punched sheets using a screen printing process. The paste is also applied within the via holes to form connections between conductor patterns. The principal metallic constituent of the paste may be gold, silver, copper, silver/palladium alloy, gold/platinum alloy, or other suitable materials. The printed green sheets are then stacked in a desired sequence using alignment holes to insure correct positioning, and laminated together at 50°–100° C. under a pressure between about 35 and 250 kg/cm². Finally, the laminated green sheets are fired at a temperature not exceeding 1000° C. to form dense, sintered ceramic multilayer circuit substrates. The firing may be done in air if the conductor metal is not susceptible to oxidation at the firing temperature. Such is the case, for example, with the metals named above, except for copper, which requires a reducing or neutral atmosphere. Sheets formed in the manner described usually have a greater density than the discs formed by the procedure of the previous examples.

The compositions of the present invention also can be used to form rigid, nonporous ceramic bodies by substantially conventional techniques. For example, the batch ingredients of any of the previous examples are combined with water and organic binders, and ball milled for a period of about 20 hours. The resulting slurry is spray dried to provide a powder of substantially spherical particles. This powder can be used to form bodies of various desired shapes by standard forming techniques, such as dry or isostatic pressing. The bodies are then fired at a suitable temperature not exceeding 1000° C. to provide dense, sintered ceramic objects.

It will be apparent to those skilled in the relevant art that various changes and modifications may be made in the embodiments described above to achieve the same or equivalent results without departing from the principles of the present invention as described and claimed herein. All such changes and modifications are intended to be covered by the following claims.

I claim as my invention:

1. A method of making low firing temperature sintered ceramic materials, comprising the steps of:
   providing a mixture consisting essentially of 10–50 wt.% alumina, 0–30 wt.% fused silica, and 50–60 wt.% of a frit composed of about 4 wt.% CaO, about 12 wt.% MgO, about 13 wt.% $Al_2O_3$, about 29 wt.% $B_2O_3$, and about 42 wt.% $SiO_2$, and
   sintering the mixture at a temperature not greater than 1000° C.

2. The method of claim 1, wherein the mixture is sintered in an oxidizing atmosphere at a temperature in the range of 850°–1000° C.

3. The method of claim 2, wherein the mixture comprises a nonzero percentage of fused silica.

4. The method of claim 1, wherein prior to sintering the mixture is formed into an object and a metallic composition is deposited on the object in a pattern.

5. The method of claim 4, wherein the metal is selected from the group consisting of gold, silver, platinum, palladium, alloys of the foregoing, and copper.

6. The method of claim 1 in which the alumina, fused silica and frit are reduced to a particle size of about 1–2 microns prior to sintering.

7. A method of making low firing temperature ceramic materials, comprising the steps of:
   providing a mixture consisting essentially of 10–50 wt.% alumina, 0–30 wt.% fused silica, and 50–60 wt.% of a frit comprising about 4 wt.% CaO, about 12 wt.% MgO, about 13 wt.% $Al_2O_3$, about 29 wt.% $B_2O_3$, and about 42 wt.% $SiO_2$; and
   sintering the mixture.

8. The method of claim 7, wherein the mixture is sintered in an oxidizing atmosphere.

9. The method of claim 7 in which the alumina, fused silica and frit are reduced to a particle size of about 1–2 microns prior to sintering.

10. A ceramic material produced by a method comprising the steps of:
    providing a mixture consisting essentially of 10–50 wt.% of alumina, 0–30 wt.% fused silica, and 50–60 wt.% of a frit composed of about 4 wt.% CaO, about 12 wt.% MgO, about 13 wt.% $Al_2O_3$, about 29 wt.% $B_2O_3$, and about 42 wt.% $SiO_2$; and
    sintering the mixture.

11. The ceramic material of claim 10, wherein the mixture is sintered at a temperature in the range of 850°–1000° C.

12. The ceramic material of claim 11, wherein the mixture contains a nonzero percentage of fused silica.

13. The ceramic material of claim 10 wherein the alumina, fused silica and frit have a particle size of about 1–2 microns prior to sintering.

14. A batch for making a low firing temperature ceramic material, the batch comprising a mixture consisting essentially of 10–50 wt.% of alumina, 0–30 wt.% fused silica, and 50–60 wt.% of a frit composed of about 4 wt.% CaO, about 12 wt.% MgO, about 13 wt.% $Al_2O_3$, about 29 wt.% $B_2O_3$, and about 42 wt.% $SiO_2$.

15. The batch of claim 14, wherein the batch contains a nonzero percentage of fused silica.

16. The batch of claim 14 herein the alumina, fused silica and frit have a particle size of about 1–2 microns prior to sintering.

* * * * *